US005592730A

United States Patent [19]

Greenstein et al.

[11] Patent Number: 5,592,730

[45] Date of Patent: Jan. 14, 1997

[54] METHOD FOR FABRICATING A Z-AXIS CONDUCTIVE BACKING LAYER FOR ACOUSTIC TRANSDUCERS USING ETCHED LEADFRAMES

[75] Inventors: Michael Greenstein, Los Altos; Henry Yoshida, San Jose, both of Calif.

[73] Assignee: Hewlett-Packard Company, Palo Alto, Calif.

[21] Appl. No.: 283,136

[22] Filed: Jul. 29, 1994

[51] Int. Cl.$^{6}$ .......................... H04R 31/00; H04R 17/00; H01L 41/22

[52] U.S. Cl. .......................... 29/594; 29/25.35; 29/827; 310/327; 310/334

[58] Field of Search .......................... 29/25.35, 594, 29/827, 417; 310/313 R, 334, 327; 427/100; 216/14

[56] References Cited

U.S. PATENT DOCUMENTS

| | | | |
|---|---|---|---|
| 4,305,014 | 12/1981 | Borburgh et al. | 310/334 |
| 4,467,237 | 8/1984 | Piaget et al. | 310/334 |
| 4,638,468 | 1/1987 | Francis | 310/334 X |
| 4,686,408 | 8/1987 | Ishiyama | 310/327 X |
| 4,747,192 | 5/1988 | Rokurota | 29/25.35 |
| 4,773,140 | 9/1988 | McAusland | 29/25.35 |
| 4,825,115 | 4/1989 | Kawabe et al. | 310/327 |
| 4,939,826 | 7/1990 | Shoup | 29/594 X |
| 5,099,459 | 3/1992 | Smith | 310/334 X |
| 5,267,221 | 11/1993 | Miller et al. | 310/327 X |
| 5,275,167 | 1/1994 | Killan | 29/25.35 X |
| 5,295,487 | 3/1994 | Saitoh et al. | 310/334 X |
| 5,296,777 | 3/1994 | Mine et al. | 310/327 X |

FOREIGN PATENT DOCUMENTS

| | | | |
|---|---|---|---|
| 5242142 | 4/1977 | Japan | 29/594 |
| 153590 | 12/1979 | Japan | 29/594 |
| 3042904 | 2/1991 | Japan | 29/25.35 |

*Primary Examiner*—Peter Vo

[57] ABSTRACT

A Z-axis backing layer for an acoustic transducer is provided, which comprises a matrix of electrical conductors disposed in parallel and potted within an electrically insulating acoustic backing material. The acoustic transducers are disposed on a first end of the backing layer, with each individual transducer element connecting electrically to a respective one of the conductors. At the other end of the backing layer, the conductors connect electrically to a corresponding circuit element. The backing layer is fabricated from a plurality of leadframes each having an outer frame member and a plurality of conductors extending in parallel across the leadframes terminating at the frame members at opposite ends thereof. The plurality of leadframes are stacked such that respective conductors of adjacent ones of the leadframes are disposed in parallel with a space provided between the respective conductors equivalent to a width of one of the leadframes. Acoustic backing material is poured onto the stacked plurality of leadframes to completely fill the spaces between conductors. The frame members and excess acoustic backing material are then removed from the stacked and poured plurality of leadframes.

15 Claims, 12 Drawing Sheets

METHOD FOR FABRICATING A Z-AXIS CONDUCTIVE BACKING LAYER FOR ACOUSTIC TRANSDUCERS USING ETCHED LEADFRAMES

BACKGROUND OF THE INVENTION

1. Field of the Invention

This invention relates to acoustic transducer arrays, and more particularly, to a method for fabricating a backing layer for use with such an array to electrically connect the individual transducer elements of the array to respective circuit elements.

2. Background of the Invention

Ultrasonic imaging systems are widely used to produce images of internal structure of a specimen or target of interest. A diagnostic ultrasonic imaging system for medical use forms images of internal tissues of a human body by electrically exciting an acoustic transducer element or an array of acoustic transducer elements to generate short ultrasonic pulses that are caused to travel into the body. Echoes from the tissues are received by the acoustic transducer element or elements and are converted into electrical signals. A circuit element, such as a printed circuit board, flexible cable or semiconductor, receives the electrical signals. The electrical signals are amplified and used to form a cross-sectional image of the tissues. These imaging techniques provide a safe, non-invasive method of obtaining diagnostic images of the human body.

The acoustic transducer which radiates the ultrasonic pulses comprises a plurality of piezoelectric elements arranged in an array with a predetermined pitch. The array is generally one or two-dimensional. By reducing the pitch of the piezoelectric elements in the array, and increasing the number of elements, the resolution of the image can be increased. An operator of the imaging system can control the phase of the electronic pulses applied to the respective piezoelectric elements in order to vary the direction of the output ultrasonic wave beam or its focus. This way, the operator can "steer" the direction of the ultrasonic wave in order to illuminate desired portions of the specimen without needing to physically manipulate the position of the transducer.

When one of the piezoelectric elements is energized, acoustic waves are transmitted both from the front surface of the element facing the imaging target and the rear surface of the element. It is desirable that the acoustic energy from the rear surface be substantially attenuated so that the image resolution is not adversely affected. If not attenuated, the rearward travelling acoustic signals can reflect off the circuit element and return to the transducer surface, causing a degradation of the desired electrical signal.

To remedy this situation, a backing layer of an acoustically attenuating material is disposed between the piezoelectric elements and the circuit element to attenuate the undesired acoustic energy from the rear surface of the piezoelectric element. Ideally, this backing layer would have an acoustic impedance matched to the impedance of the piezoelectric elements so that a substantial portion of the acoustic energy at the rear surface of the piezoelectric element is coupled into the backing layer.

A problem with the use of a backing layer between the piezoelectric element and the circuit element is that of providing electrical interconnection between the particular piezoelectric elements and the associated circuit elements. The interconnection problem is more difficult for two-dimensional arrays of more than three rows and columns of piezoelectric elements, since the internal elements will not have an exposed edge that easily accommodates electrical connection. In such two-dimensional arrays, electrical interconnection between the individual piezoelectric elements and the electric circuit which receives and processes the electrical signals is generally made in the Z-axis direction perpendicular to the array. However, as the number of elements within the array increases, and the pitch between the elements decreases, it becomes increasingly difficult to fabricate this interconnection.

One approach to provide the interconnection through the backing layer is disclosed in U.S. Pat. No. 4,825,115 by Kawabe et al., entitled ULTRASONIC TRANSDUCER AND METHOD FOR FABRICATING THEREOF. Kawabe teaches the use of printed wiring boards bonded directly to the piezoelectric array transducer elements. A backing layer is then molded onto the array around the boards, which extend outward from the molded backing layer. While Kawabe discloses a reliable interconnection method, the wiring boards provide a surface for undesired reflection of acoustic wave energy within the backing layer, and thus mitigate some of the beneficial acoustic attenuating properties of the backing layer.

Another approach is to form the entire backing layer from a contiguous block of acoustic attenuating material, as disclosed in U.S. Pat. No. 5,267,221 by Miller et al., entitled BACKING FOR ACOUSTIC TRANSDUCER ARRAY. Since the contiguous backing layer is generally free of internal obstructions, such as the Kawabe wiring boards, the backing layer would provide improved overall acoustic attenuating ability. Nevertheless, fabrication of the contiguous backing layer requires that delicate electrical conductors be threaded entirely through the solid backing layer without breakage. In practice, this presents a rather difficult task to accomplish, especially given large matrix size acoustic arrays having relatively narrow pitch and high numbers of individual transducer elements. As a result, the contiguous construction backing layer is not generally conducive to certain large scale fabrication techniques despite its other clear advantages.

Therefore, a critical need exists for an improved method for fabricating a backing layer to provide electrical interconnection between elements of an acoustic transducer array and corresponding contacts of an electrical circuit element. Such a backing layer should provide for sufficient attenuation of the outputted acoustic energy from the rear surface of the piezoelectric element while avoiding internal reflections of such energy back to the transducer element. The fabrication method should also be cost effective and readily adaptable for large transducer arrays having high numbers of piezoelectric elements with relatively small pitch.

SUMMARY OF THE INVENTION

In accordance with the teachings of this invention, a Z-axis backing layer for an acoustic transducer is provided. The backing layer comprises a matrix of electrical conductors disposed in parallel and potted within an electrically insulating and acoustic attenuating backing material. The acoustic transducers are disposed on a first end of the backing layer, with each individual transducer element connected electrically to a respective one of the conductors. At the other end of the backing layer, the conductors are connected electrically to a corresponding circuit element.

In an embodiment of the invention, the backing layer is fabricated from a plurality of leadframes each having an outer frame member and a plurality of conductors extending in parallel across the leadframes. The conductors terminate at the frame members at opposite ends thereof. The plurality of leadframes are stacked such that respective conductors of adjacent ones of the leadframes are disposed in parallel with a space provided between the respective conductors equivalent to a width of one of the leadframes. Acoustic backing material is poured onto the stacked plurality of leadframes to completely fill the spaces between conductors. The frame members and excess acoustic backing material are then removed from the stacked and poured plurality of leadframes.

In particular, the step of providing a plurality of leadframes further comprises applying photo-resistive material to a sheet of leadframe material. A trace pattern containing the plurality of leadframes is imaged onto the photo-resistive material. The leadframe material is selectively etched, and the etched leadframe material is passivated. The individual ones of the leadframes are then separated for use in the backing layer.

The pouring step further comprises applying a vacuum to the stacked and poured plurality of leadframes for a first period of time. The stacked and poured plurality of leadframes are then pressed with a predetermined amount of pressure. Finally, the stacked and poured plurality of leadframes are heated to a predetermined temperature for a second period of time. After removal from the high temperature bake, the edges of said stacked and poured plurality of leadframes are ground to desired dimension and flatness.

A more complete understanding of the Z-axis conductive backing for acoustic transducers using etched leadframes will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

This invention provides an improved method for fabricating an acoustic attenuating backing layer that provides electrical interconnection between elements of an acoustic transducer array and corresponding contacts of an electrical circuit element. The method is readily adaptable for large transducer arrays having high numbers of piezoelectric elements with relatively small pitch.

Figure 1:
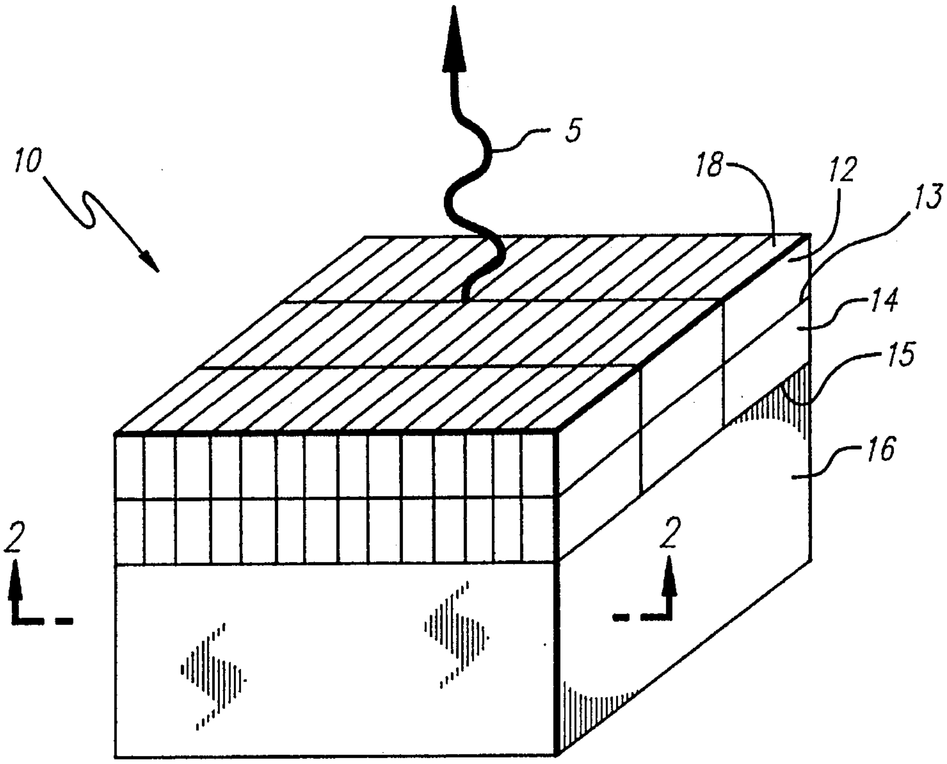
FIG. 1 illustrates a perspective view of an acoustic transducer array.

Referring first to FIG. 1, an acoustical transducer phased array 10 is illustrated. A representative acoustic wave 5 is shown being emitted from a central portion of the transducer array 10. The array 10 comprises a matching layer 12, a piezoelectric layer 14, and a backing layer 16. The piezoelectric layer 14 provides an acoustic resonator that produces acoustic waves in response to an electrical signal. The acoustic waves are transmitted from both the upper surface 13 of the piezoelectric layer 14, as well as the lower surface 15 of the piezoelectric layer. The piezoelectric layer 14 may be comprised of any material which generates acoustic waves in response to an electric field applied across the material, such as lead zirconium titanate. The matching layer 12 increases the forward power transfer of the acoustic waves from the piezoelectric layer 14 into the load. The backing layer 16 serves to attenuate acoustic waves traveling from the rear surface 15 of the piezoelectric layer 14, and also provides electrical connection from each piezoelectric element to an external circuit element.

The piezoelectric layer 14 and matching layer 12 are bonded to the backing layer 16 by use of an epoxy or other suitable adhesive. Then, the piezoelectric layer 14 and the matching layer 12 are partitioned into a plurality of individual piezoelectric elements 18 disposed in a array. The array size is described in terms of its azimuthal direction (x-axis) and its elevational direction (y-axis). For example, FIG. 1 illustrates a 14×3 element acoustic transducer array, though it should be apparent that other size arrays can be constructed in similar fashion. Two-dimensional array may be substantially larger, such as 64×64 or 128×128. By varying the phase of the electrical signal provided to each particular piezoelectric element 18, the resulting acoustic signal can be selectively controlled or "steered."

Figure 2:
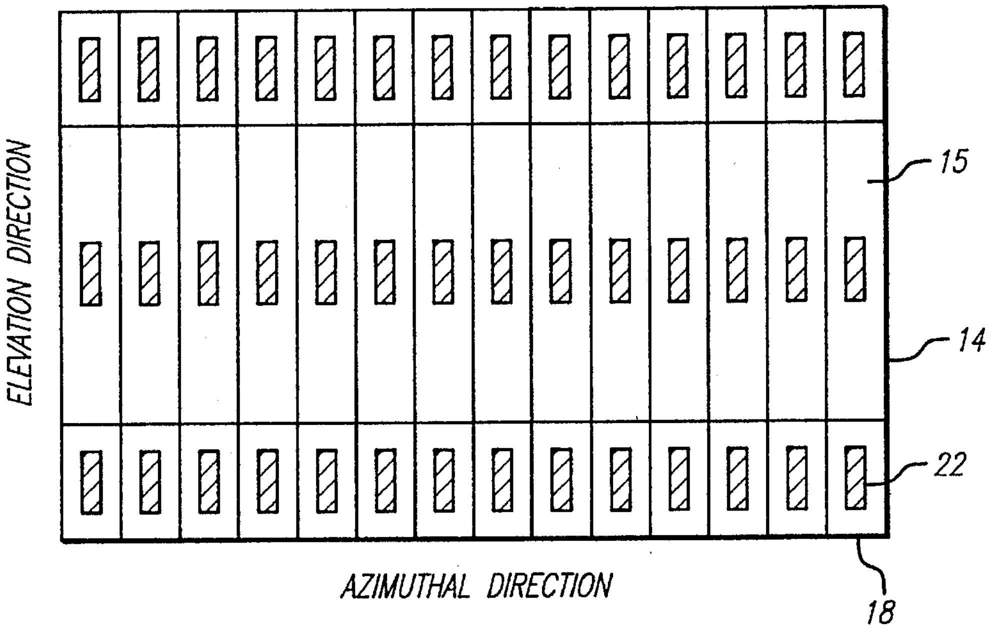
FIG. 2 illustrates a top sectional view of the acoustic transducer array, as taken through the section 2—2 of FIG. 1.

FIG. 2 illustrates the lower surface 15 of the piezoelectric layer 14 segmented into the 14×3 array of individual piezoelectric elements 18. Electrically conductive traces 22 extend in the Z-axis direction through the backing layer 16 to electrically connect with the piezoelectric elements 18 at the lower surface 15. The electrical signal to each respective piezoelectric element 18 is conducted through the electrically conductive traces 22.

Figure 3:
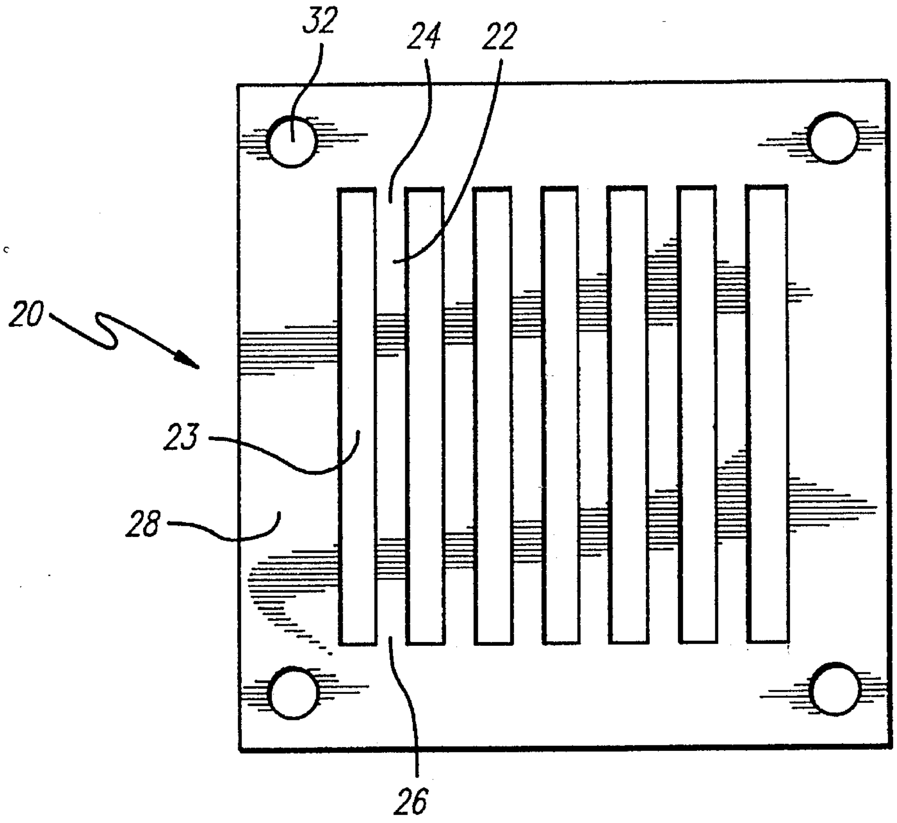
FIG. 3 illustrates a patterned leadframe having a plurality of conductive trace elements.
Figure 4:
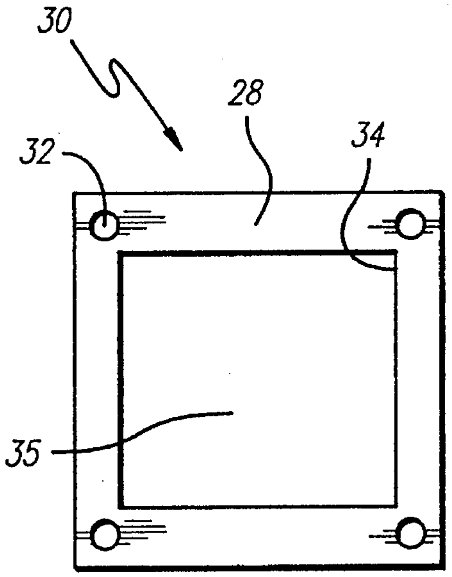
FIG. 4 illustrates a patterned leadframe having a spacer element.
Figure 5:
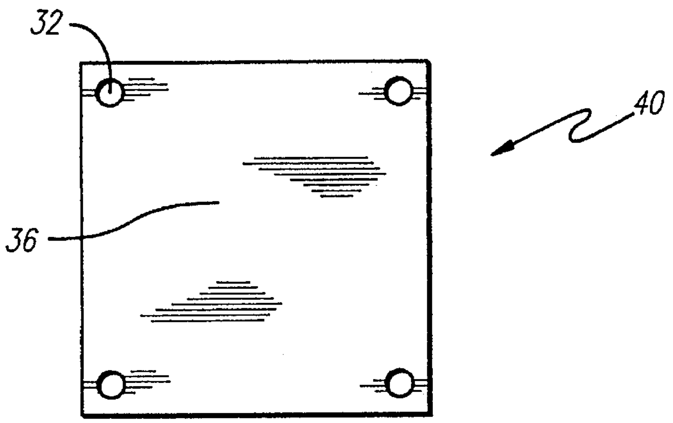
FIG. 5 illustrates a patterned leadframe having an end element.

The conductive traces 22 of the backing layer 16 are fabricated from a plurality of leadframes, as illustrated in FIGS. 3, 4, and 5. A leadframe is a thin sheet of electrically conductive material, such as BeCu, typically used in the manufacture of integrated circuits. Leadframes can be selectively etched to incorporate a desired pattern, such as to provide electrical connection between a semiconductor substrate of an integrated circuit and external circuit elements. In this application, however, the leadframes are patterned to provide conductive trace elements within the backing layer 16 of the acoustic transducer.

A first type of leadframe, referred to as a trace leadframe 20, is illustrated in FIG. 3. The trace leadframe 20 is generally rectangular in shape having an outer frame portion 28 and a plurality of conductive traces 22 extending in parallel across a width dimension of the leadframe. The conductive traces 22 are separated by slots 23 etched through the leadframe material, and terminate at opposite sides of the frame member 28 at end points 24, 26. The trace leadframe 20 has a plurality of alignment holes 32 disposed in the frame member 28 at each of the four corners thereof. As will be further described below, the width of the conductive traces 22 and spacing between adjacent ones of the conductive traces can be selected to provide a desired transducer array size.

FIG. 4 illustrates a second type of leadframe, referred to as a spacer leadframe 30. The spacer leadframe 30 has a rectangular shape and comprises a frame member 28 and alignment holes 32, as in the trace leadframe 20. Instead of conductive traces 22, however, the second type of leadframe 30 has an open space 35 bounded by the frame member 28 along an inside edge 34. The spacer leadframe 30 is used to define a space width between conductive traces 22 of adjacent ones of the trace leadframes 20, as will be further described below.

FIG. 5 illustrates a third type of leadframe, referred to as an end leadframe 40. The end leadframe 40 similarly has a rectangular shape and alignment holes 32 as in the trace leadframe 20 and spacer leadframe 30. Unlike the previous leadframes, the interior portion 36 of the end leadframe 40 is completely solid, having no opening etched therethrough. The end leadframe 40 provides an end element for the backing layer 16, as will be further described below.

Each of the three types of leadframes are formed from a thin metal sheet, such as comprising BeCu material, by a conventional etching process. A photo-resistive material is first applied to the sheet of leadframe material. A pattern representative of the leadframes is then imaged onto the photo-resistive material. Next, each leadframe is immersed in an etchant solution, such as Ferric Chloride or Sodium Persulfate. The slots 23 formed between adjacent ones of the conductive traces 22 are opened through the etching process. The remaining etched leadframe material is then passivated by an electroplating process, such as by electroplating a CrAu layer onto the etched leadframes.

Figure 6:
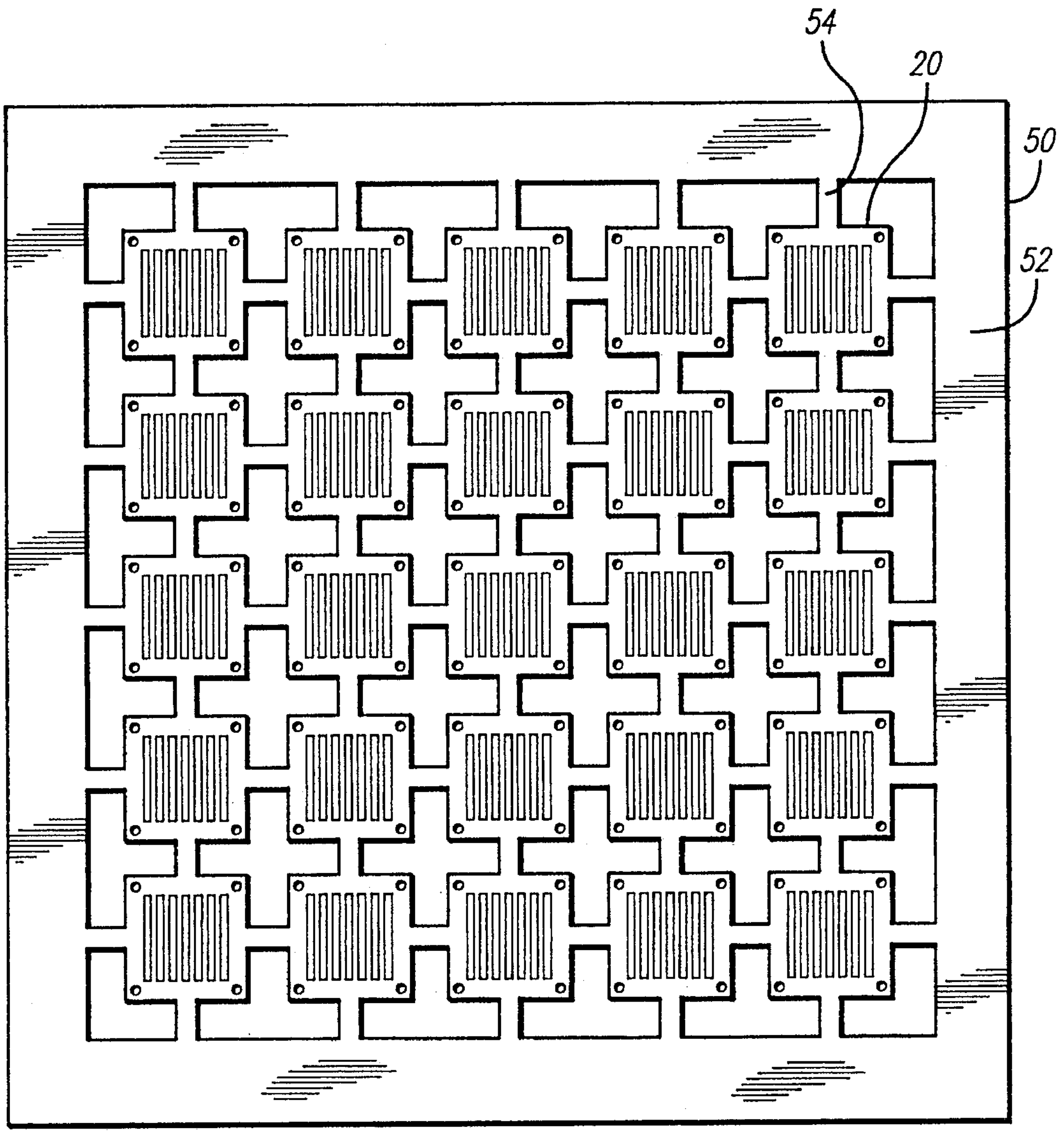
FIG. 6 illustrates a single substrate containing a plurality of patterned leadframes.

As illustrated in FIG. 6, a single sheet of BeCu material 50 may be utilized to fabricate a plurality of leadframes simultaneously. The sheet 50 is shown as containing twenty-five individual trace leadframes 20 suspended within an outer frame 52 by use of common support tabs 54. The support tabs 54 further act as a common electrode for the passivation electroplating. After the passivation step is complete, the individual trace leadframes 20 are separated from the sheet 50 for use in fabricating the backing layer 16. The process is repeated in similar fashion for fabrication of the spacer and end leadframes 30, 40. It should be apparent that a large quantity of leadframes can be produced by repeating this process.

Figure 8:
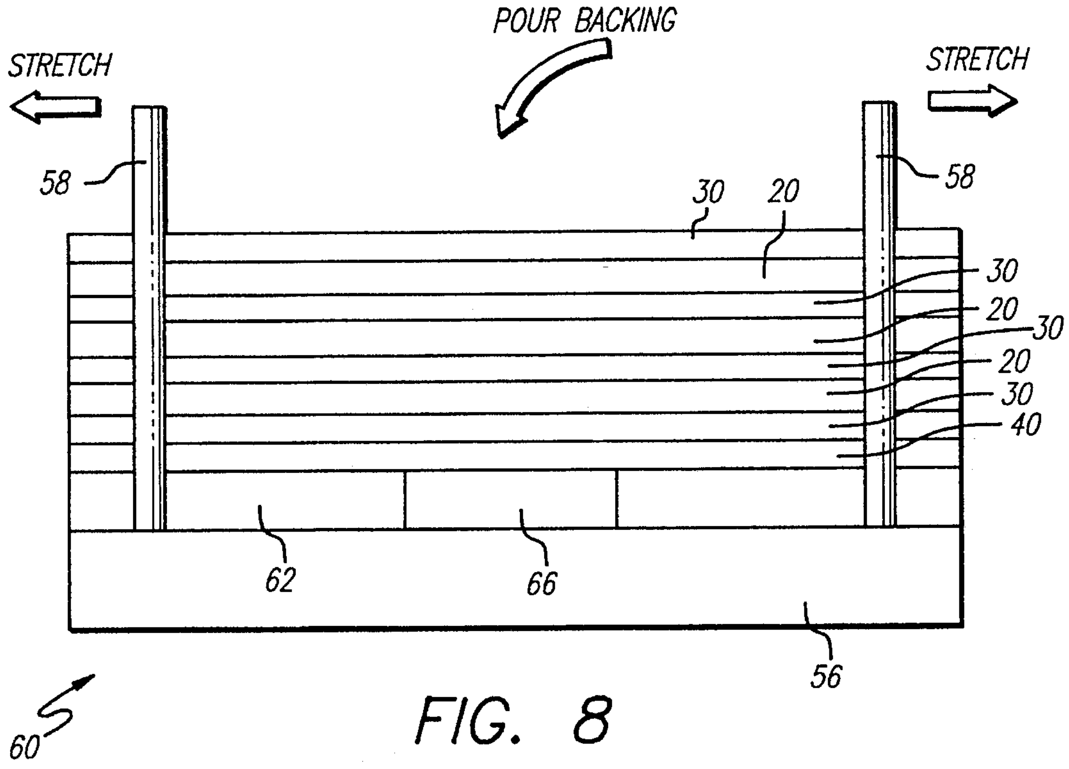
FIG. 8 illustrates a stack of leadframes disposed on an assembly fixture.
Figure 9:
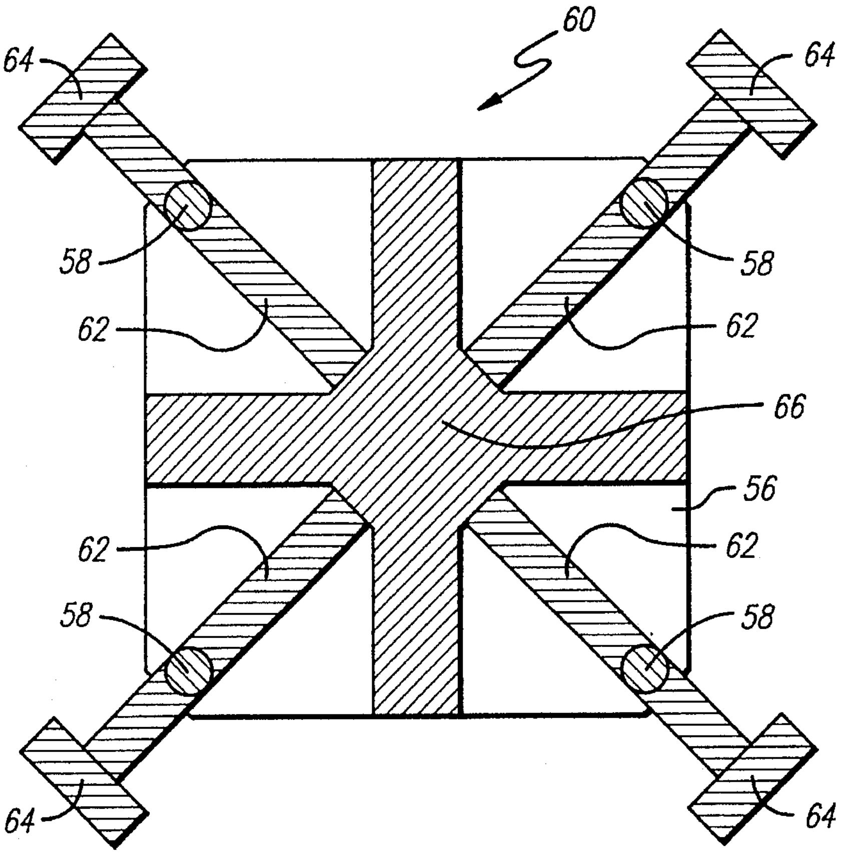
FIG. 9 illustrates a top view of the assembly fixture.

The finished leadframes are then assembled together onto a stacking fixture 60, as illustrated in FIGS. 8 and 9. The fixture 60 comprises a rectangular base plate 56 supporting a center support 66 that abuts respective bottom stacking plates 62 that extend from a center of the base plate toward the corners of the base plate. Perpendicularly disposed alignment pins. 58 extend upwardly from each respective stacking plate 62. The stacking plates 62 mechanically connect to an expansion screw 64. As illustrated, there are four stacking plates 62 and four alignment pins 58 corresponding to the four alignment holes 32 of each of the three types of leadframe. Rotation of an expansion screw 64 causes the associated stacking plate 62 to move radially outward along with the associated alignment pin 58.

The leadframes are stacked onto the fixture 60 such that the alignment pins 58 engage respective alignment holes 32 of the leadframes. An end leadframe 40 is first disposed on the fixture 60 above the stacking plates 62, followed by a spacer leadframe 30. Next, a trace leadframe 20 is disposed onto the spacer leadframe 30, and another spacer leadframe 30 disposed on top of the trace leadframe. Additional trace and spacer leadframes are stacked in like manner onto the fixture 56, until a desired number of layers is obtained. The trace leadframes 20 are disposed such that the conductive traces 22 of each respective leadframe are parallel to one another. The expansion screws 64 are then rotated to move the alignment pins 58 in the outward direction, stretching the leadframes laterally to insure planarity of the leadframes. In practice, it is only necessary to adjust three out of the four expansion screws 64 to apply the necessary stretching force to the leadframes.

Figure 7:
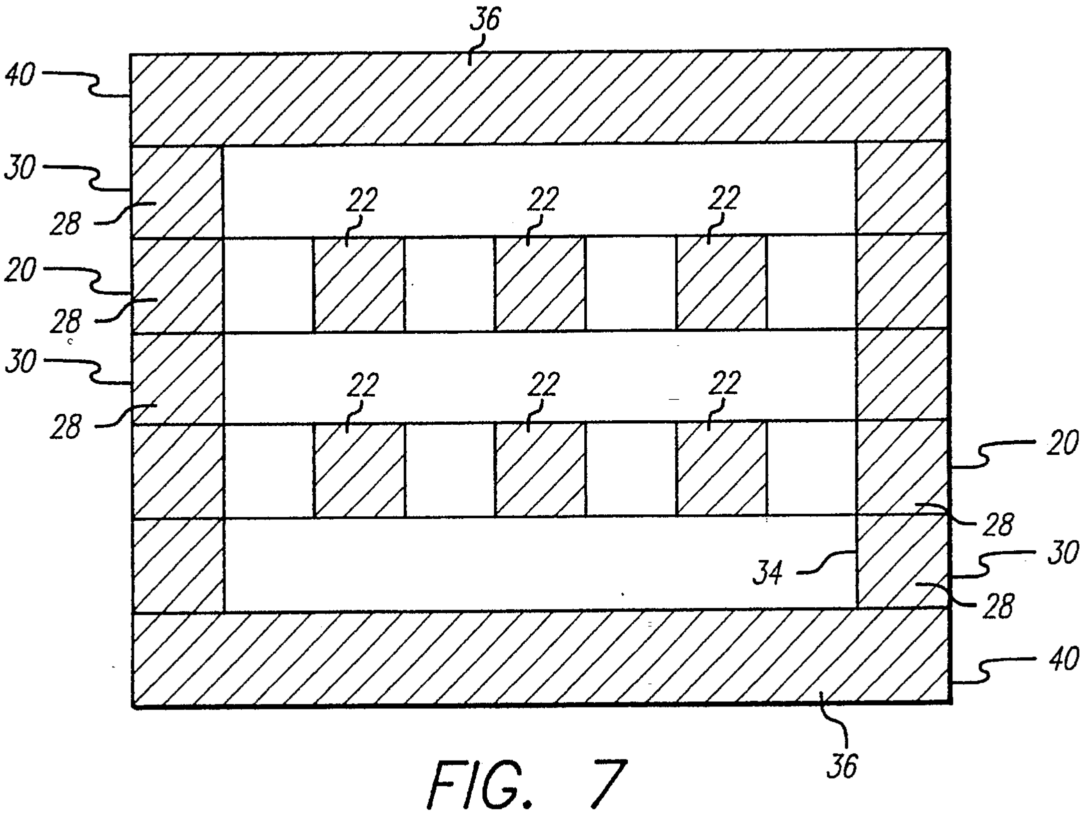
FIG. 7 illustrates a cross-sectional top view of a stack of patterned leadframes.

FIG. 7 illustrates in cross section an exemplary stack of leadframes for forming a backing layer of a 3×2 transducer array. The stack has end leadframes 40 at both the bottom and the top of the stack. Disposed between the end leadframes 40 are alternating spacer and trace leadframes 30, 20. The trace leadframes 20 each have three conductive traces 22. The frame elements 28 of the trace and spacer leadframes 20, 30 are aligned.

Typically, the thickness of each trace leadframe is less than or equal to one quarter of the wavelength ($\lambda/4$) of the operating frequency of interest. The trace and spacer leadframes 20, 30 combine to form the same $\lambda/2$ pitch as is typical for the piezoelectric elements of a $\lambda/2$ sampled two-dimensional array. The spacer leadframes 30 prevent adjacent ones of the trace leadframes 20 from shorting against one another. The relative thickness of the trace leadframe 20 and spacer leadframe may be identical, or may be different, so long as the trace and spacer leadframe widths sum up to the piezoelectric element pitch.

In particular, it may be desirable to use a trace leadframe 20 which is thinner than the spacer leadframe 30 to minimize the perturbation of the conductive trace 22 on the transducer. For example, FIG. 2 illustrates two-dimensional array elements having unequal azimuthal and elevational dimensions in which the thickness of the spacer leadframe 30 is greater than the trace leadframe 20. Multiple spacer leadframes 30 can also be used between each trace leadframe to further increase spacing between conductive traces 22.

Once the desired number of leadframes are stacked onto the fixture 60, an electrically insulating backing material is poured into the stack, as illustrated in FIG. 8. The liquified backing material permeates the entire stack, filling all the spaces disposed between adjacent conductive traces 22 and within the spaces 35 of the spacer leadframes 30. It is anticipated that the backing material comprises an epoxy material having acoustic absorbers and scatterers such as tungsten, silica, or chloroprene particles, although other materials having like acoustic absorbing characteristics could also be advantageously used.

Figure 10:
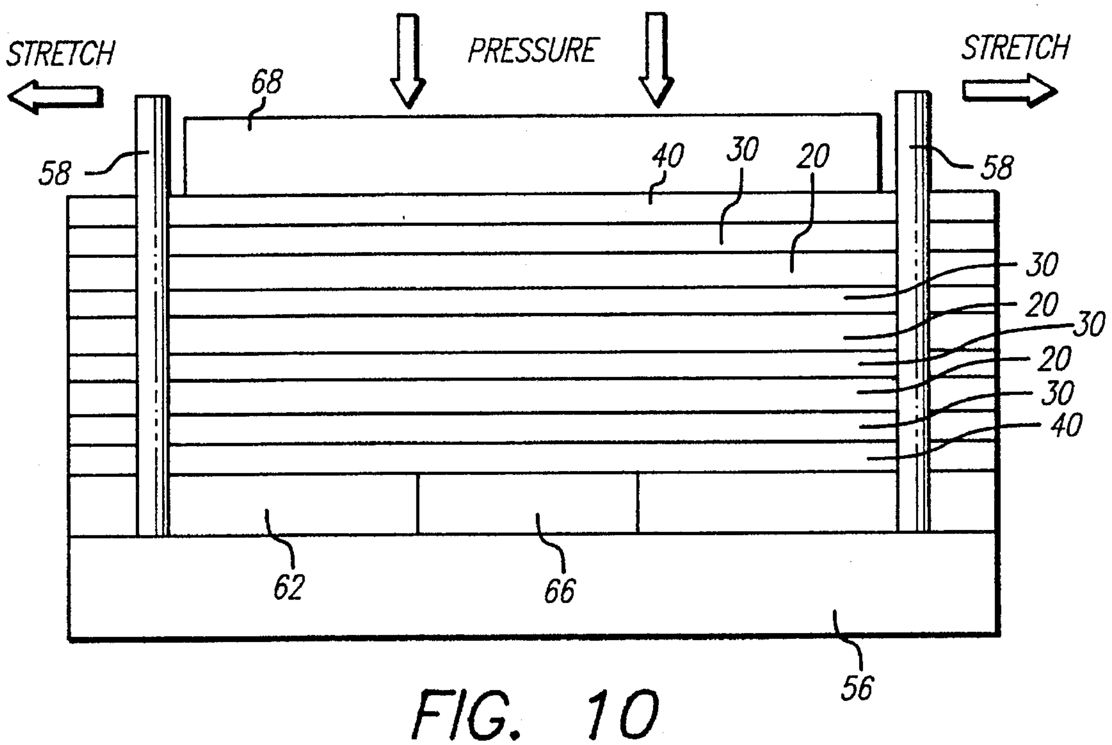
FIG. 10 illustrates a stack of leadframes disposed on the assembly fixture during curing of the acoustic attenuating material.

After the backing material is poured, heat and pressure are applied to the permeated stack of leadframes to cure the liquified backing material and form a rough backing layer structure. The stack is placed in a vacuum oven for a predetermined period of time (approximately 10 minutes) to de-gas the backing material and draw out any undesired air bubbles which may have inadvertently become lodged within the structure. Then, a top stacking plate 68 is disposed on top of the stack, as illustrated in FIG. 10, to allow the stack to be pressure loaded. The stacking plate 68 provides for even distribution of the pressure load onto the permeated stack. With the pressure load (approximately 50 psi) in place, the stack is placed into an oven to bake the backing material into a solid structure (approximately 12 hours at 50 degrees centigrade). It should be apparent to those skilled in the art that the recited time, pressure and temperature values depend, in part, upon the materials selected, the desired operational characteristics of the backing layer, and the array size selected, and that other values can also be advantageously utilized. After completion of the heat and pressure steps, the permeated stack is removed from the oven and permitted to cool. The backing material then hardens into a solid structure.

Figure 12:
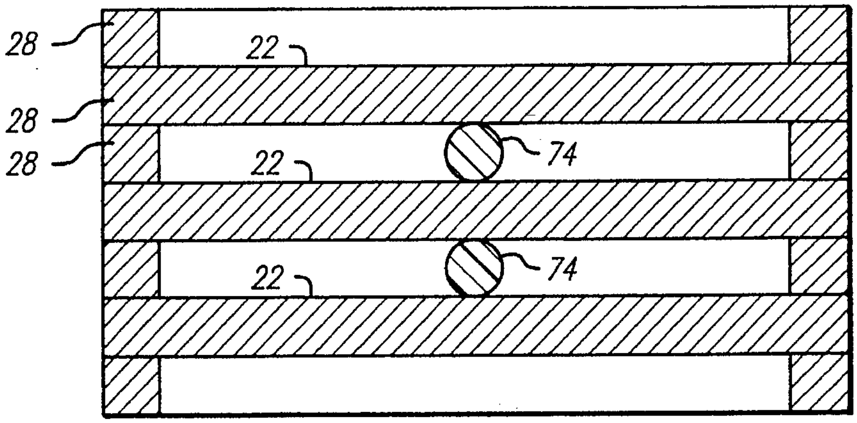
FIG. 12 illustrates a sectional side view of the cured backing layer assembly having insulating spacer bars.

The leadframes may also be stacked onto the fixture 60 interlaced with insulating cross bracing elements 74 disposed perpendicularly with the conductive traces 22, as illustrated in FIG. 12. The cross bracing elements 74 prevent the conductive traces 22 from sagging in the middle, notwithstanding the stretching force applied by the alignment pins 58. The cross bracing elements 74 are comprised of an electrically insulating material to prevent conductivity between the adjacent conductive 22. The liquified backing material is then poured into the stack with the cross bracing elements 74 in place. Alternatively, an insulating coating may be applied to the trace leadframes 20 to further prevent undesired electrical communication.

Figure 11:
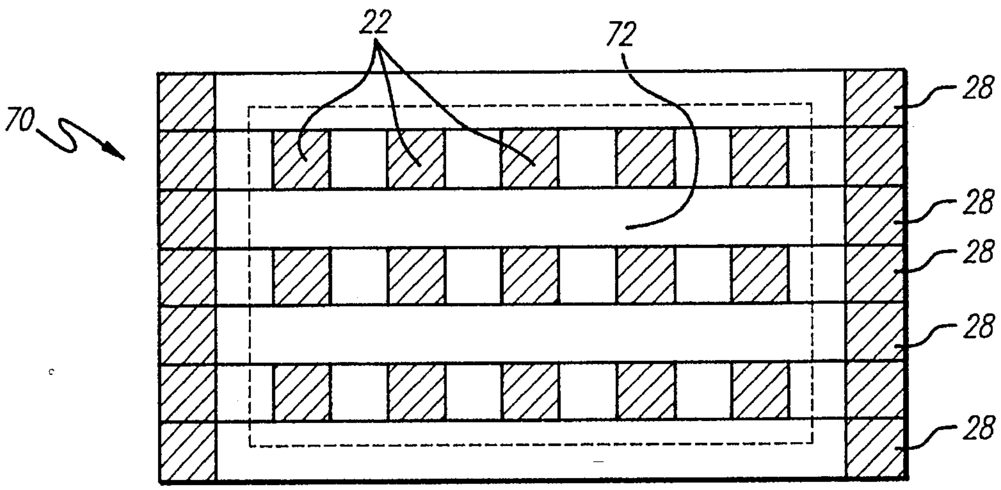
FIG. 11 illustrates a sectional top view of a cured backing layer assembly.
Figure 14:
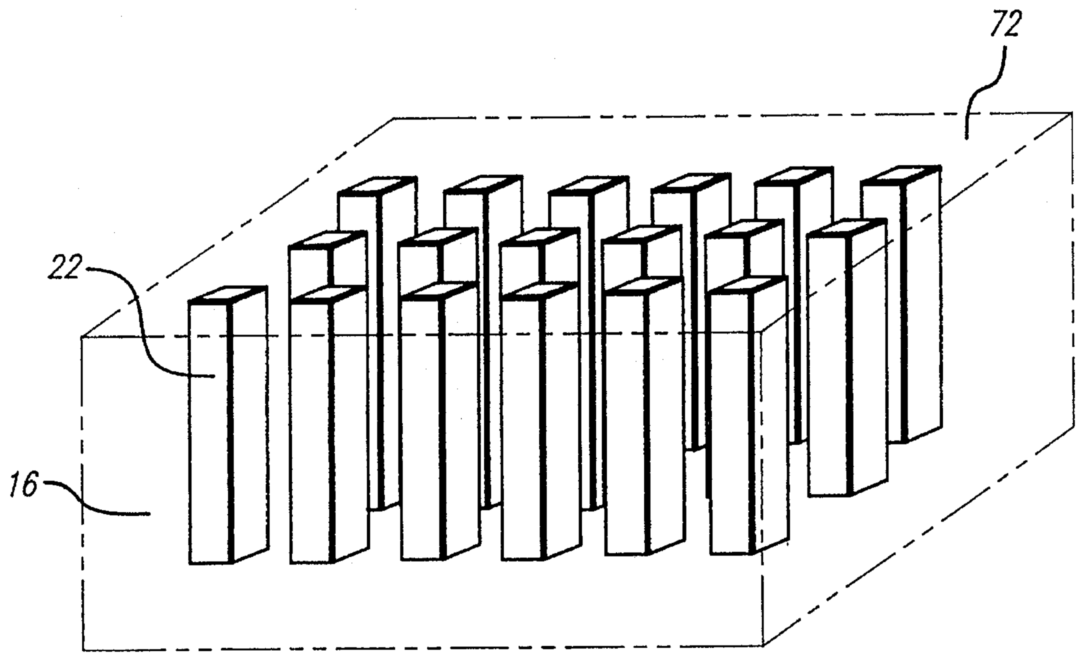
FIG. 14 illustrates an isometric view of a plurality of conductors disposed within a backing layer.

The cooled and solidified backing layer structure, illustrated at 70 in FIG. 11, is then removed from the fixture 60 and machined into a final shape. The top surface 72, is ground flat to insure a good bond with the piezoelectric layer 14. Side edges of the structure 70 containing the frame members 28 of the individual leadframes are also removed, resulting in a finished shape denoted by the dotted line in FIG. 11. The resulting structure has the electrically conductive traces 22 extending lengthwise therethrough while being otherwise unconnected to each other. Further, an insulating coating formed by the backing material remains along all external surfaces of the structure 70. A finished backing layer structure 16 with the embedded conductive traces 22 is illustrated in FIG. 14.

Figure 15:
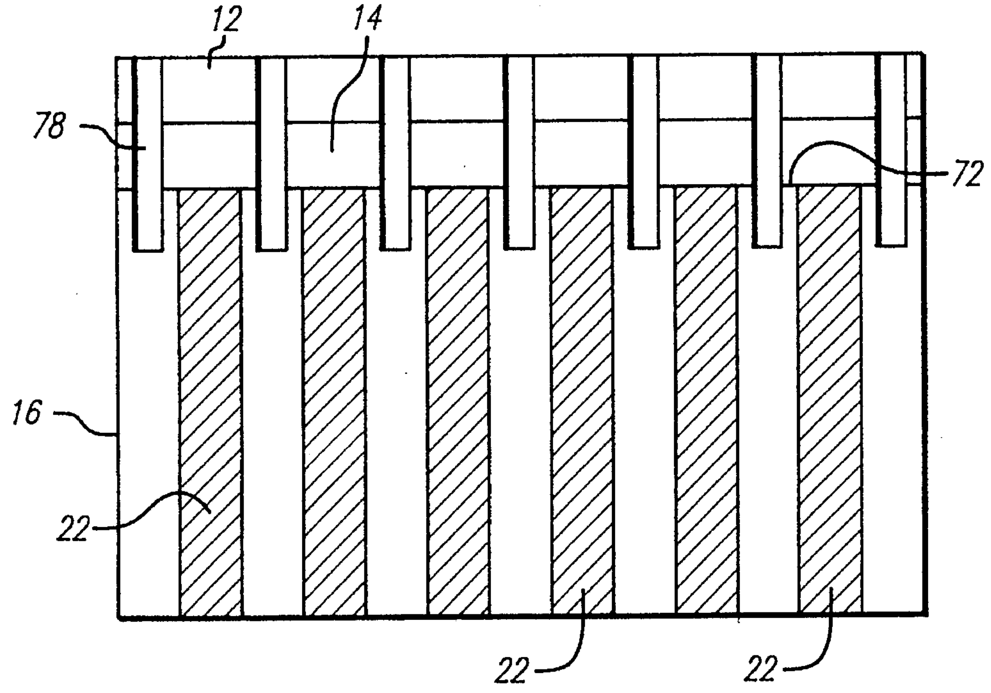
FIG. 15 illustrates a sectional side view of a finished backing layer having piezoelectric elements and a matching layer attached thereto.

After the machining step is complete, the piezoelectric layer 14 and matching layer 12 can be bonded to the top surface 72 of the backing layer 16. Using a dicing saw, the piezoelectric layer 14, matching layer 12 and an upper portion of the backing layer 16 is diced to form individual piezoelectric transducer elements, as illustrated in FIG. 15. Each individual transducer element is electrically connected to an associated one of the conductive traces 22, and is acoustically isolated from adjacent transducer elements by the kerf lines 78 formed by the dicing saw.

Figure 13:
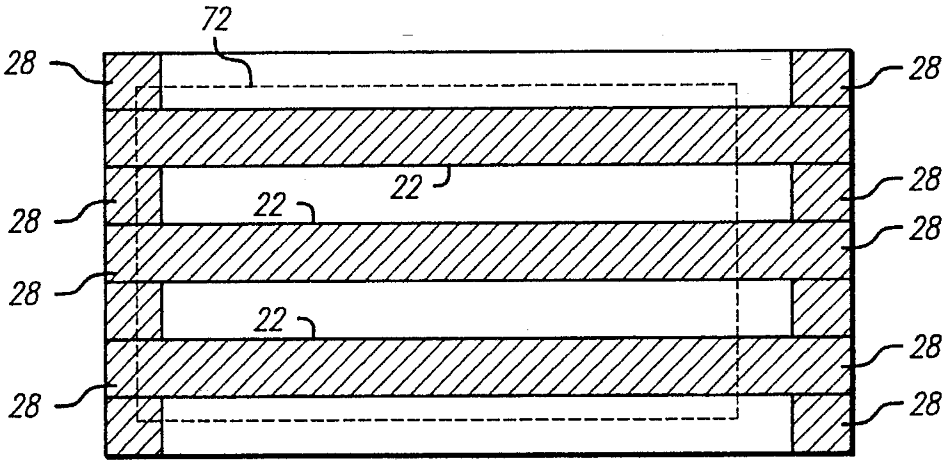
FIG. 13 illustrates a sectional side view of the cured backing layer aligned for attachment of a piezoelectric transducer layer.

Alternatively, the top surface 72 can be machined as illustrated in the side view of FIG. 13, leaving a portion of the frame members 28 intact to provide a self-aligning structure with the piezoelectric layer 14. Each of the frame members 28 are in physical contact with each other, and are thus electrically connected together. After bonding the piezoelectric layer 14 and matching layer 12, these layers are diced through the remaining portion of the frame members 28 into the backing material. This insures good electrical connection between the conductive traces 22 and the piezoelectric layer 14, and eliminates the necessity of perfectly aligning the dicing saw with the imbedded conductive traces.

Figure 16:
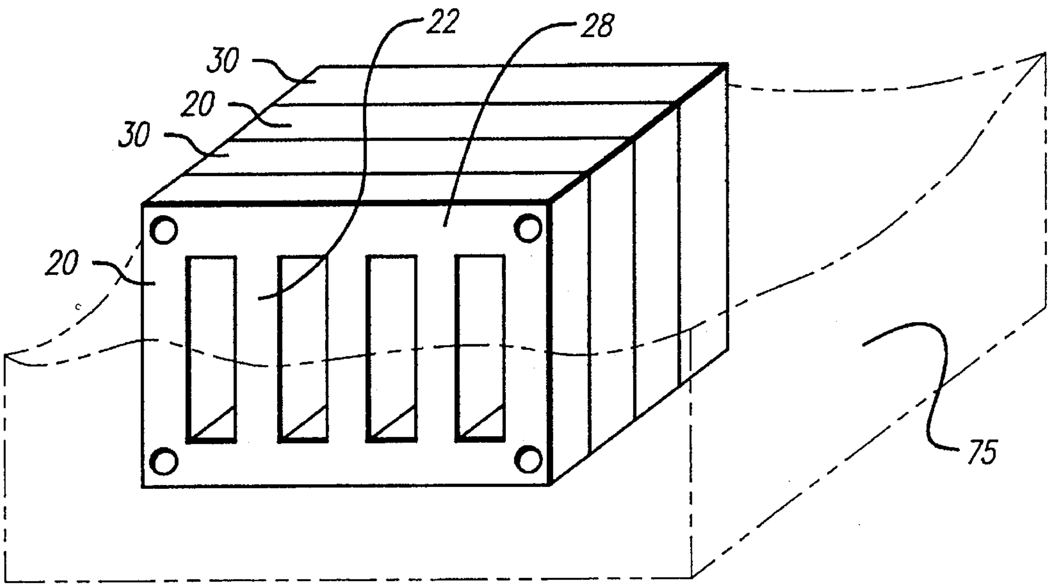
FIG. 16 illustrates an alternative embodiment of the backing layer in which conductive elements of the leadframes extend outwardly of the acoustic attenuating material.
Figure 17:
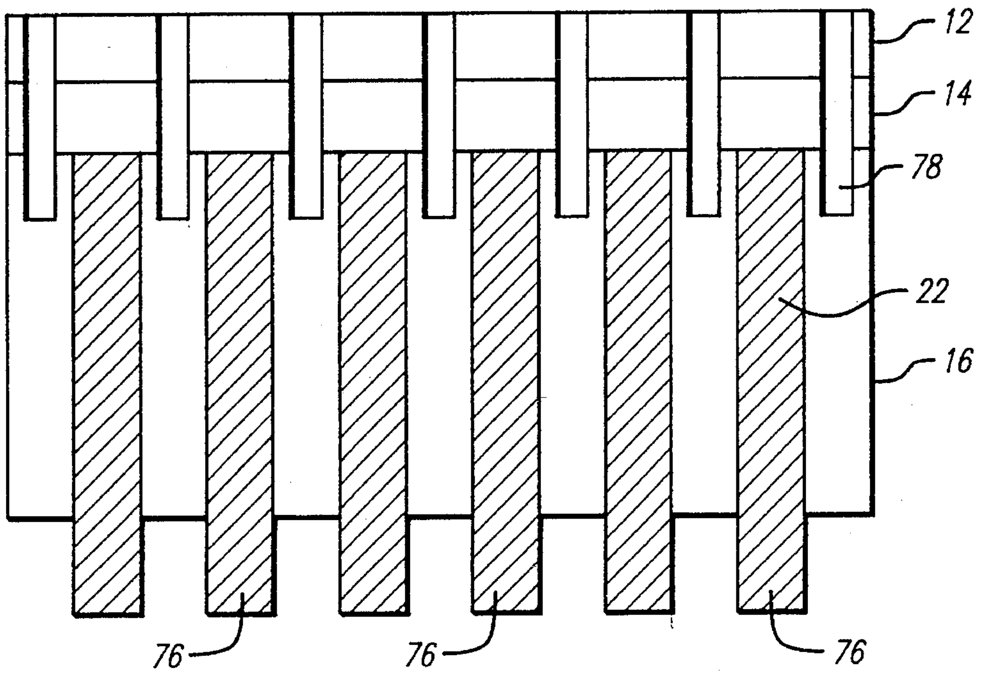
FIG. 17 illustrates a sectional side view of the alternative embodiment of the backing layer illustrating the electrical conductors extending outwardly of the acoustic attenuating material.

In another embodiment of the invention, the conductive traces 22 can be permitted to extend outwardly from an end of the backing layer, providing tabs that can connect electrically to an external circuit element, such as a circuit board. After the leadframes are stacked into the fixture 60, the liquified backing material is poured into the stack with the stack turned sideways, as illustrated in FIG. 16. The backing material does not completely cover the stack; instead, an end of the stack protrudes from the surface of the backing material (illustrated in phantom at 75). The backing layer is cured and machined as described above, and the frame members 28 of the protruding portion of the stack are removed, leaving tabs 76. As illustrated in FIG. 17, the piezoelectric layer 14 and matching layer 12 are bonded to the opposite end of the backing layer 16 from the protruding tabs 76, and the layers diced as before to form the individual transducer elements. The tabs 76 provide electrical connection with the conductive traces 22 to the individual transducer elements.

For acoustic transducer elements which are large compared to the cross sectional area of the embedded conductive traces 22, the presence of the conductive traces presents a minimal perturbation on the acoustic backing environment of the transducer element. In smaller transducer elements, however, it may be necessary to reduce the cross sectional area of the conductive trace at the end of the trace near the lower surface 15 of the piezoelectric layer 14.

Alternative embodiments of conductive traces 22 having reduced cross-sectional area are disclosed in FIGS. 18–24.

Figure 18:
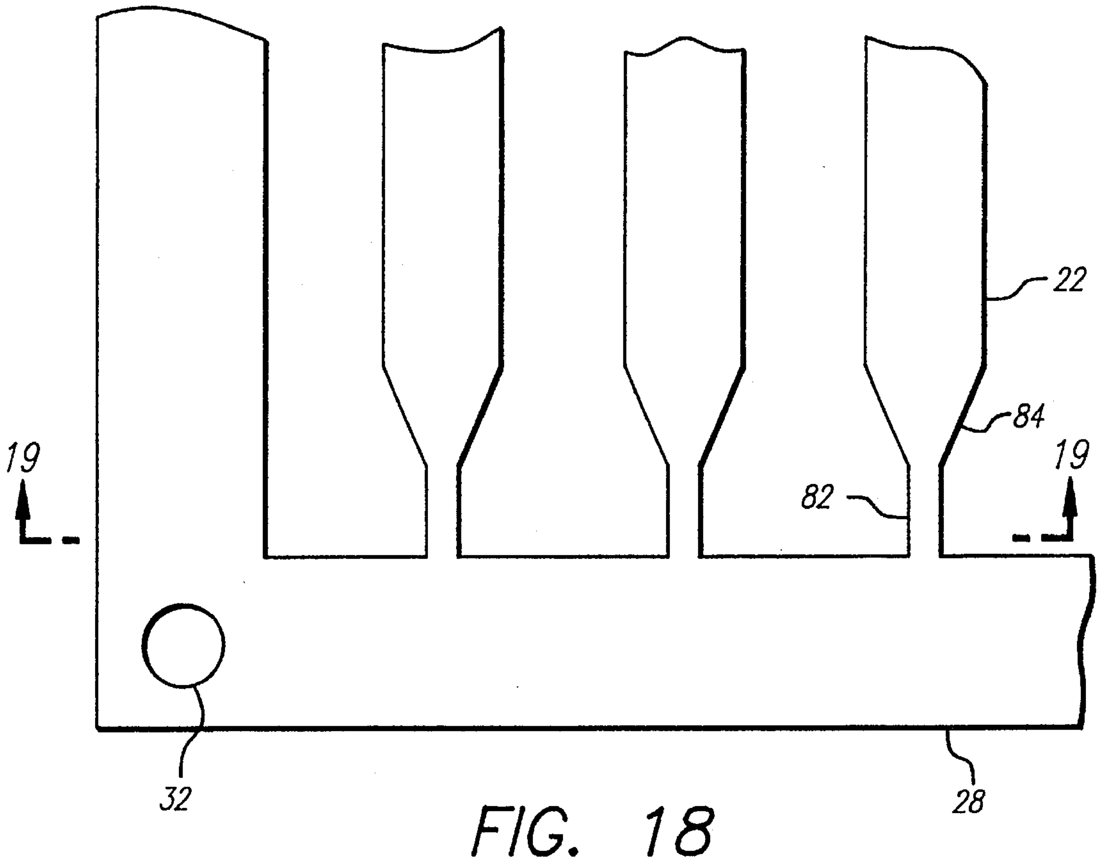
FIG. 18 illustrates an alternative embodiment of a leadframe having narrowed end portions.
Figure 19:
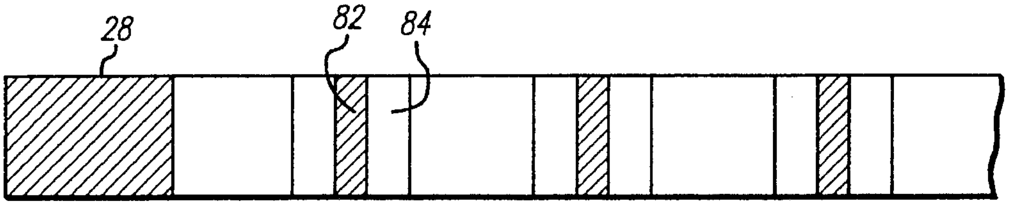
FIG. 19 illustrates a sectional end view of the alternative leadframe of FIG. 18, as taken through the section 19—19.

FIGS. 18 and 19 show conductive traces 22 that taper to a narrow width portion 82 at the connection with the frame member 28. The conductive traces 22 have a tapered portion 84 disposed between the normal width portion and the narrow width portion 82. The alternative trace leadframe 20 is fabricated in the same manner as described above, with a modified pattern etched onto the BeCu leadframe material.

Figure 20:
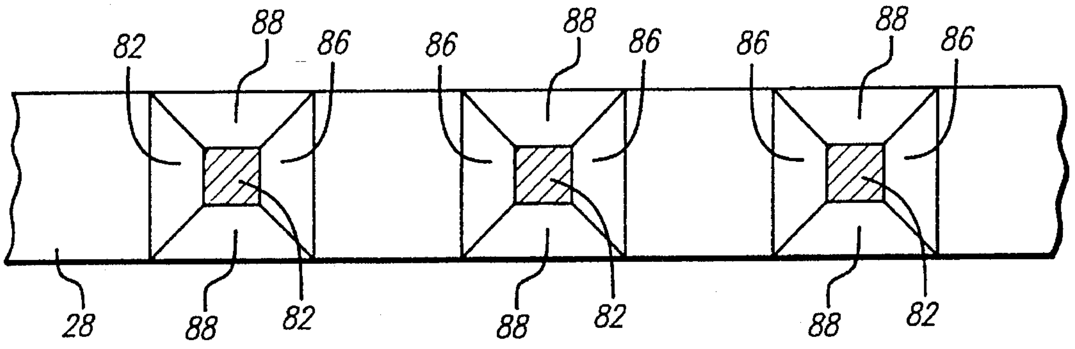
FIG. 20 illustrates a sectional end view of a second alternative leadframe, as taken through the section 19—19 of FIG. 18.
Figure 21:
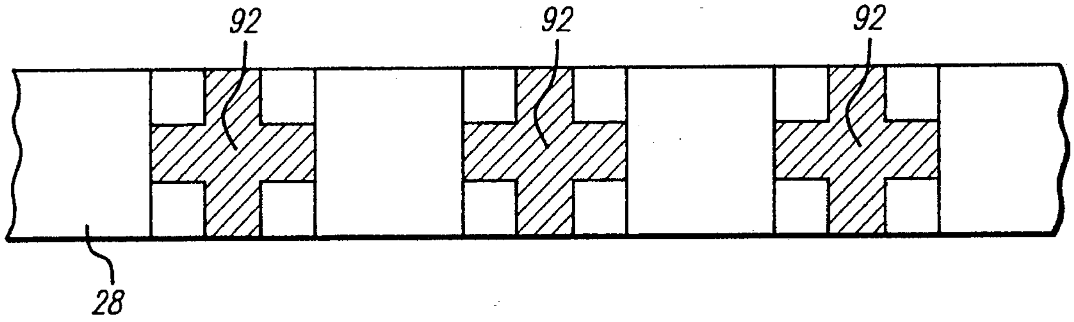
FIG. 21 illustrates a sectional end view of a third alternative leadframe, as taken through the section 19—19 of FIG. 18.

The leadframes may be further modified so that the narrowing occurs in more than one dimension. FIG. 20 illustrates conductive traces 22 having tapered portions in the width dimension 86 as well as in the thickness dimension 88 of the leadframe. As known in the art, the narrowing in the thickness dimension 88 is achieved by controlling the imaging and etchant timing. FIG. 21 illustrates an embodiment of the conductive trace 22 that is narrowed into the shape of a cross 92.

Figure 22:
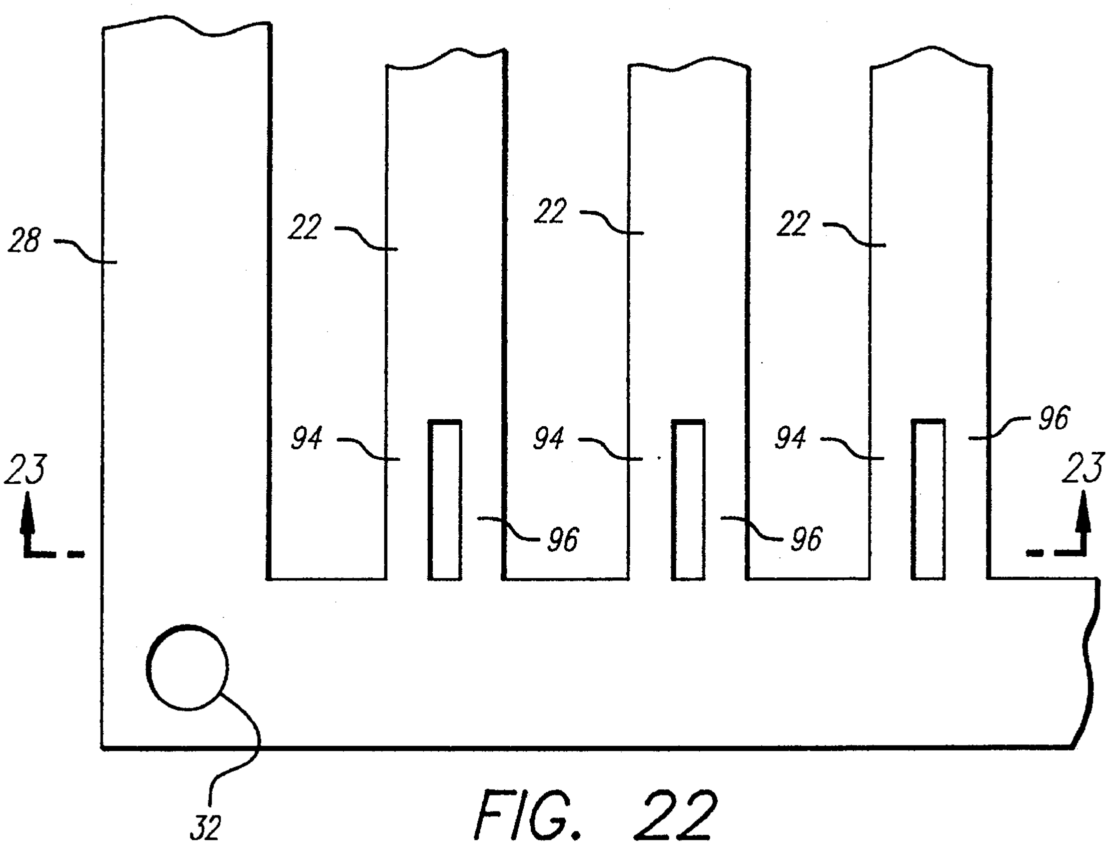
FIG. 22 illustrates a fourth alternative embodiment of the leadframe.
Figure 23:
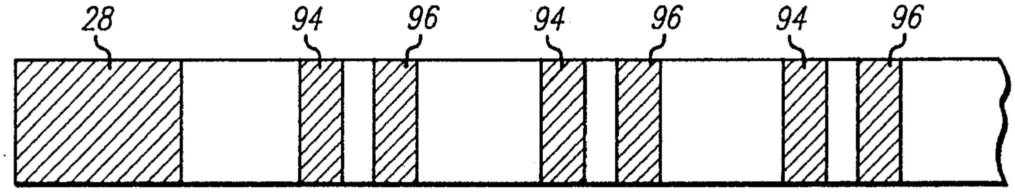
FIG. 23 illustrates a sectional end view of the fourth alternative embodiment of the leadframe, as taken through the section 23—23 of FIG. 22.

In another alternative geometry of the conductive trace 22, the contact area of the trace is reduced, and the contact area is removed from the center of the piezoelectric element. As illustrated in FIGS. 22 and 23, each conductive trace is patterned into two smaller subtraces 94, 96 which are positioned against the piezoelectric element at the outside edges of the element where the acoustic displacement and energy density are the lowest.

Figure 24:
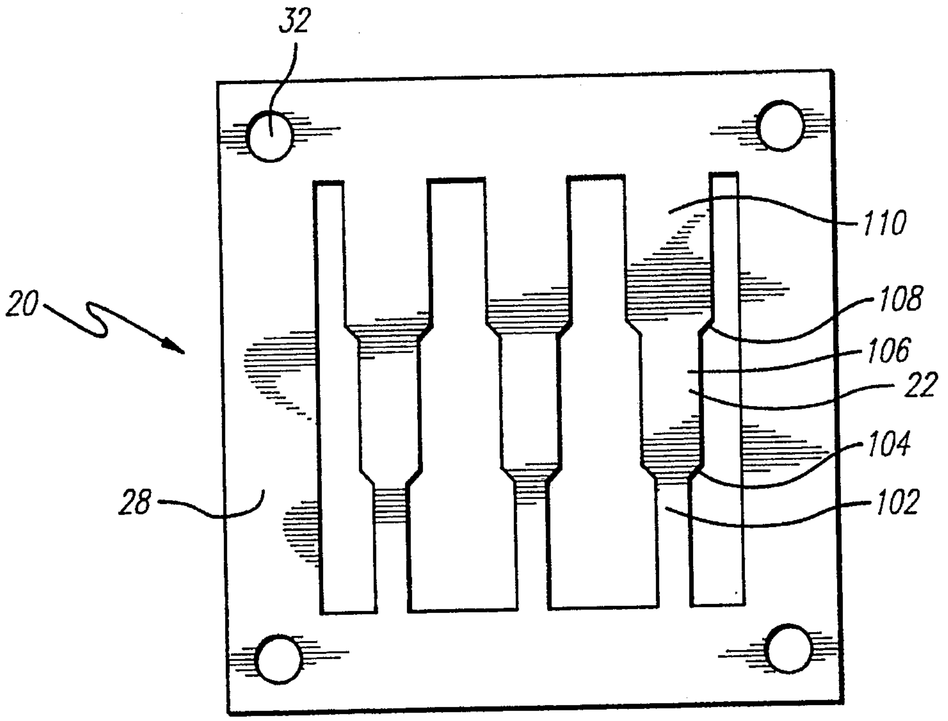
FIG. 24 illustrates a fifth alternative embodiment of the leadframe having a tapered cross-section.

In FIG. 24, the conductive trace 22 is tapered in the width dimension along an entire length of the trace. A narrowest width portion 102 is disposed at an end of the conductive trace 22 which contacts the piezoelectric element. A first tapered portion 104 increases the width from the narrowest portion 102 to an intermediate width portion 106. A second tapered portion 108 further increases the width from the intermediate width portion 106 to a full width portion 110. It should be apparent that a greater or lesser number of tapered portions could be advantageously utilized to vary the rate in which the conductive trace 22 changes in width from a first end to a second end. It should also be apparent that the conductive trace 22 could similarly taper in the thickness dimension as well as the width dimension, as discussed above with respect to FIGS. 20 and 21.

Figure 25:
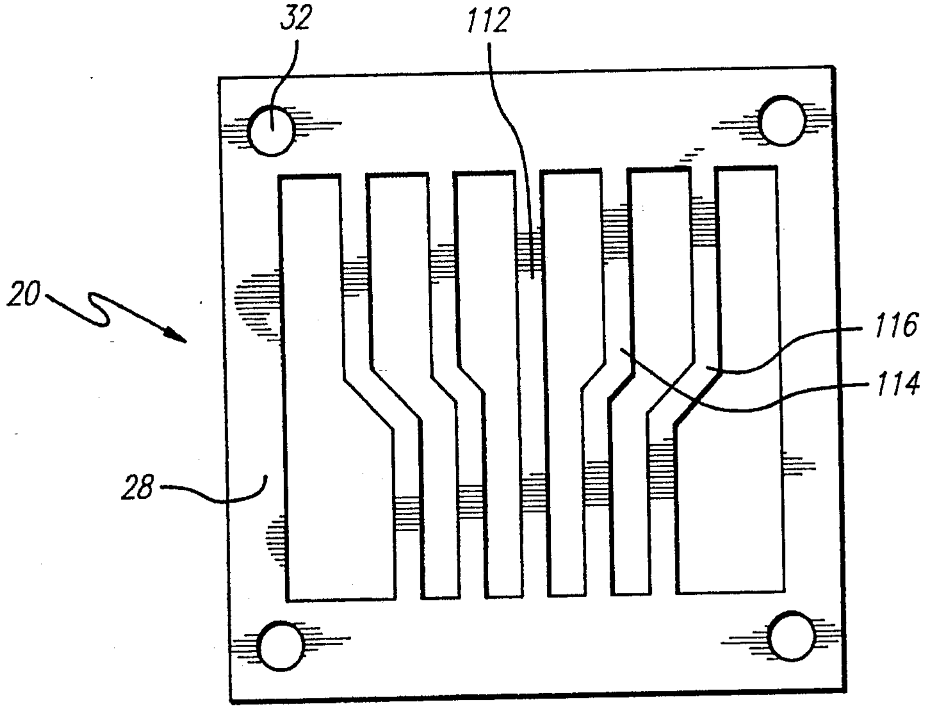
FIG. 25 illustrates a sixth alternative embodiment of the leadframe having expanding pitch.

Finally, FIG. 25 illustrates an alternative embodiment of a trace leadframe 20 utilizing expanding pitch, also referred to as "dimensional fan out." In this embodiment, the spacing between individual ones of the conductive traces 22 is greater at a first end of the traces than at a second end. The narrower spacing at the first end is intended to match the pitch of the individual piezoelectric transducers, while the wider spacing at the second end facilitates connection to a circuit element. The conductive traces may include a centrally disposed trace 112 that extends directly across the leadframe, and angled traces 114, 116 having varying degrees of offset relative to the centrally disposed trace. The dimensional fan out could be evenly spaced across the width of the leadframe, as depicted in FIG. 25, or could have the individual conductive traces offset to either the left or right side of the leadframe.

Having thus described a preferred embodiment of a backing layer for acoustic transducers using etched leadframes, it should be apparent to those skilled in the art that certain advantages of the within system have been achieved. The invention is further defined by the following claims.

What is claimed is:

1. A method for fabricating a backing layer for use in an acoustic transducer, said method comprising the steps of:

providing a plurality of spacer leadframes each having an outer frame member and a space defined within said outer frame member;

providing a plurality of trace leadframes each having an outer frame member and at least one conductor extending across said leadframes terminating at said outer frame members of trace leadframes at opposite ends thereof;

stacking said plurality of trace leadframes alternatingly with said spacer leadframes such that respective conductors of adjacent ones of said trace leadframes are disposed with a space defined between said respective conductors of adjacent ones of said trace leadframes;

pouring an electrically insulating acoustic backing material onto said stacked plurality of trace leadframes to completely fill said spaces defined between said respective conductors; and removing said frame members and excess acoustic backing material from said stacked and poured plurality of trace leadframes, thereby forming the backing layer.

2. The method for fabricating a backing layer of claim 1 wherein said pouring step further comprises the steps of:

applying a vacuum to said stacked and poured plurality of trace leadframes for a first period of time;

loading said stacked and poured plurality of trace leadframes with a predetermined amount of pressure; and heating said stacked and poured plurality of trace leadframes to a predetermined temperature for a second period of time.

3. The method for fabricating a backing layer of claim 1 wherein said removing step further comprises the step of grinding edges of said stacked and poured plurality of trace leadframes to desired dimension and flatness.

4. The method for fabricating a backing layer of claim 1 wherein said stacking step further comprises the step of stretching said plurality of trace leadframes by applying force at corners of said frame members in an outward direction.

5. The method for fabricating a backing layer of claim 1 wherein said conductors further comprise a tapered cross-section along an entire length thereof.

6. The method for fabricating a backing layer of claim 1 wherein said stacking step further comprises the step of inserting insulating brace members in said spaces perpendicularly with said conductors.

7. The method for fabricating a backing layer of claim 1 further comprising a plurality of spacer leadframes having an open space defined within an outer frame member.

8. The method for fabricating a backing layer of claim 7, wherein said acoustic transducer further comprises a plurality of transducer elements aligned in a matrix, and a combined width of one of said trace leadframes and one of said spacer leadframes is equivalent to a pitch between adjacent ones of said transducer elements.

9. The method for fabricating a backing layer of claim 8 wherein said at least one conductor further comprises a plurality of conductors have a spacing therebetween equivalent to said pitch between adjacent ones of said transducer elements at a first end thereof, and a substantially different spacing therebetween at a second end thereof.

10. The method for fabricating a backing layer of claim 7 wherein said step of providing a plurality of leadframes further comprises the steps of:

applying photo-resistive material to a sheet of leadframe material;

imaging a trace pattern onto the photo-resistive material, said trace pattern containing selected ones of said trace and spacer leadframes;

etching through said leadframe material with an etchant to form said selected ones of said trace and spacer leadframes;

passivating said etched leadframe material; and separating said selected ones of said trace and spacer leadframes.

11. The method for fabricating a backing layer of claim 10 wherein said leadframe material comprises BeCu.

12. The method for fabricating an acoustic transducer of claim 1 wherein said at least one conductor further comprise a tapered cross-section along an entire length thereof.

13. The method for fabricating an acoustic transducer of claim 1 wherein said at least one conductor further comprise a reduced cross-section portion at an end thereof.

14. A method for fabricating an acoustic transducer array comprising the steps of:

providing a plurality of trace leadframes each having an outer frame member and a plurality of conductors extending across said leadframes terminating at said frame members at opposite ends thereof;

providing a plurality of spacer leadframes each having an outer frame member and a space defined within said outer frame member;

stacking said plurality of trace leadframes alternatingly with said spacer leadframes such that respective conductors of adjacent ones of said trace leadframes are disposed with said space defined in said spacer leadframes between said respective conductors;

pouring an acoustic backing material onto said stacked plurality of trace and spacer leadframes to completely fill said spaces between conductors of adjacent trace leadframes;

removing said frame members and excess acoustic backing material from said stacked and poured plurality of trace and spacer leadframes to provide a finished backing layer;

bonding a layer of piezoelectric material onto an end of said backing layer;

bonding a matching layer onto said layer of piezoelectric material; and dicing said piezoelectric and matching layers to provide individual transducer elements having a pitch between adjacent ones of said transducer elements equivalent to a combined width of one of said trace leadframes and one of said spacer leadframes,thereby forming the transducer array.

15. The method for fabricating an acoustic transducer of claim 14, wherein said dicing step further comprises cutting partially into said finished backing layer.

* * * * *